US007079490B1

(12) United States Patent
Hady et al.

(10) Patent No.: US 7,079,490 B1
(45) Date of Patent: Jul. 18, 2006

(54) INTEGRATED CIRCUIT WITH TRACE ANALYZER

(75) Inventors: Frank Hady, Portland, OR (US); Rick Coulson, Portland, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/204,257

(22) Filed: Dec. 3, 1998

(51) Int. Cl.
*H04L 12/26* (2006.01)
*G06F 11/00* (2006.01)
*G01R 31/28* (2006.01)

(52) U.S. Cl. .................. 370/241; 370/402; 370/463; 714/30; 714/742

(58) Field of Classification Search ........ 370/252–253, 370/401, 463, 241, 402; 714/30–31, 37, 714/47, 742
See application file for complete search history.

(56) References Cited

U.S. PATENT DOCUMENTS

| | | | | |
|---|---|---|---|---|
| 4,156,286 | A | * | 5/1979 | Connors et al. .............. 365/45 |
| 5,418,452 | A | * | 5/1995 | Pyle ......................... 324/158.1 |
| 5,546,406 | A | * | 8/1996 | Gillenwater et al. ........ 714/733 |
| 5,608,867 | A | * | 3/1997 | Ishihara ................. 395/184.01 |
| 5,850,512 | A | * | 12/1998 | Song ..................... 395/183.19 |
| 5,943,490 | A | * | 8/1999 | Sample ....................... 703/28 |
| 6,014,334 | A | * | 1/2000 | Patel et al. ............ 365/189.08 |
| 6,119,254 | A | * | 9/2000 | Assouad et al. ............ 714/724 |
| 6,145,099 | A | * | 11/2000 | Shindou ...................... 714/37 |
| 6,182,247 | B1 | * | 1/2001 | Herrmann et al. ............ 714/39 |

OTHER PUBLICATIONS

"Intel 440 FX PCIset 82441FX (PMC) and 82442FX (DBX) Specification Update," Release Date: Apr., 1997.
"EISA Support for Intel 440FX PCIset Platform," Date: May 1996.
"Intel 440FX PCIset 82441FX PCI and Memory Controller (PMC) 82442FX Data Bus Accelerator (DBX)".
Processor and Bus Support for HP Logic Analyzers, obtained from—HTTP://www.TMO.HP.COM/TMO/Datasheets/English/HP16700-Series.HTML (Date Unknown).
HP 16600A and 16700A Series Logic Analysis System Mainframes, Obtained from—HTTP://www.TMO.HP.COM/TMO/DDatasheets/English/HP16700-Series.HTML (Date Unknown).
HP E2925A 32 Bit, 33 MHz PCI Exerciser and Analyzer, Obtained from—HTTP://www.tmo.hp.com/tmo/datasheets/English/HPE2925A.html (Date Unknown).

* cited by examiner

*Primary Examiner*—Chau Nguyen
*Assistant Examiner*—Tri H. Phan
(74) *Attorney, Agent, or Firm*—Kenyon & Kenyon LLP

(57) ABSTRACT

An integrated circuit includes a trace analyzer to sample, process and store data carried along internal or external data path of the circuit. The trace analyzer may include a multiplexer, a sampler, a formatter and a memory controller. The trace analyzer samples data on a predetermined basis, processes it and caused the processed data to be stored in a memory.

25 Claims, 4 Drawing Sheets

INTEGRATED CIRCUIT WITH TRACE ANALYZER

BACKGROUND

The present invention relates to a diagnostic tool for use in integrated circuits.

As is known, modern computer systems are populated by a number of integrated circuits. The integrated circuits provide a dense packaging of circuit components. For example, the Pentium® Pro Processor, commercially available from Intel Corporation, is a processor device provided in a ceramic package having dimensions of 2.66 inches by 2.46 inches. However, on a 0.25 µm process, all processing elements for the Pentium® II Processor are provided in a semi-conductor wafer which is approximately 450 mils by 450 mils.

FIG. 1 illustrates components of an exemplary computer system. The system 100 may include a processor 110, a graphics controller 120, one or more memories 130, and one or more peripheral devices 140. In the example of FIG. 1 a bridge interface 150 manages data traffic to and from other components 110–140. As illustrated, the bridge interface 150 may communicate directly with the graphics controller 120 and memory 130. It may communicate with the processor 110 via a first data bus 160 and it may communicate with the peripheral devices 140 via a second data bus 170. Other implementations are possible. An example of a conventional bridge interface 150 may be found in "INTEL 440 FX PCI Set: 82441 FX PCI and Memory Controller (PMC) and 82442FX Data Bus Accelerator (DBX)," Order No. 290549-001 available from Intel Corp., P.O. Box 58119, Santa Clara, Calif. 95052-8119. In known computer systems, the processor 110, graphics controller 120, memory 130, peripheral devices 140 and bridge interface 150 each are provided as separate integrated circuits.

For diagnostic and optimization purposes, designers of computer systems find it useful to monitor data transmitted among components 110–150 of the computer system 100. For example, a trace device 180 may be attached to bus 170 to monitor data exchanged between bridge 150 and a peripheral device 140. As is known, electrical signals transferred on bus 170 move too quickly to be observed by the human eye. Therefore, the trace 180 typically is implemented as a programmable device and is programmed to measure and store data in a memory on the trace 180. For example, trace 180 may be programmed to record all active data on bus 170. Alternatively, trace 180 may be programmed to measure all data of a particular type of data transaction. A variety of data measurement techniques are known for diagnostic or optimization purposes. Exemplary trace devices 180 include, for PCI buses, the model no. HP 2926A PCI bus analyzer and, for motherboard buses, the model no. 16700A logic analyzer, both commercially available from Hewlett Packard. There are others.

A trace may be provided between any of the integrated circuits illustrated in FIG. 1. For example, trace device 190 is shown in communication with a data path 125 extending from the graphics controller 120 to the bridge interface 150. Again, trace 190 may be programmed to record some or all of the data transferred between the graphics controller 120 and bridge interface 150 according to known techniques.

As is known, traces 180, 190 are physically interconnected with data paths extending between components. That is, a technician selectively establishes electrical connections between traces 180, 190 and the wires that carry data to be analyzed.

Advances in circuit integration may make it possible to include more powerful functionality into a single integrated circuit. An example is shown in FIG. 2. There, a single chip 280 is shown to include the functionality of a bridge interface 250 and a graphics controller 220. The bridge interface 250 and graphics controller 220 may be provided in discrete portions of the chip 280 and still may communicate data over an internal communications path 225. However, because communication path 225 is manufactured within the chip 280, it would not be possible for a technician to interface a trace to the communication path 225 to record data placed thereon. This occurs simply because circuit components are provided within chip 280 at such a high density that it would be difficult if not impossible for a technician to create the required electrical connections. Thus, while it is desirable to provide increasing functionality into a single integrated circuit, doing so provides a distinct disadvantage: It may be no longer possible to perform trace analysis according to conventional techniques.

Accordingly, there is a need in the art for a trace analyzer provided within an integrated circuit. There is a further need in the art for a trace analyzer that records data provided along data paths within the integrated circuits.

SUMMARY

Embodiments of the present invention provide an integrated circuit having a trace analyzer therein. The integrated circuit includes a plurality of data paths and the trace analyzer includes input paths connected to the data paths.

DETAILED INVENTION

Figure 1:
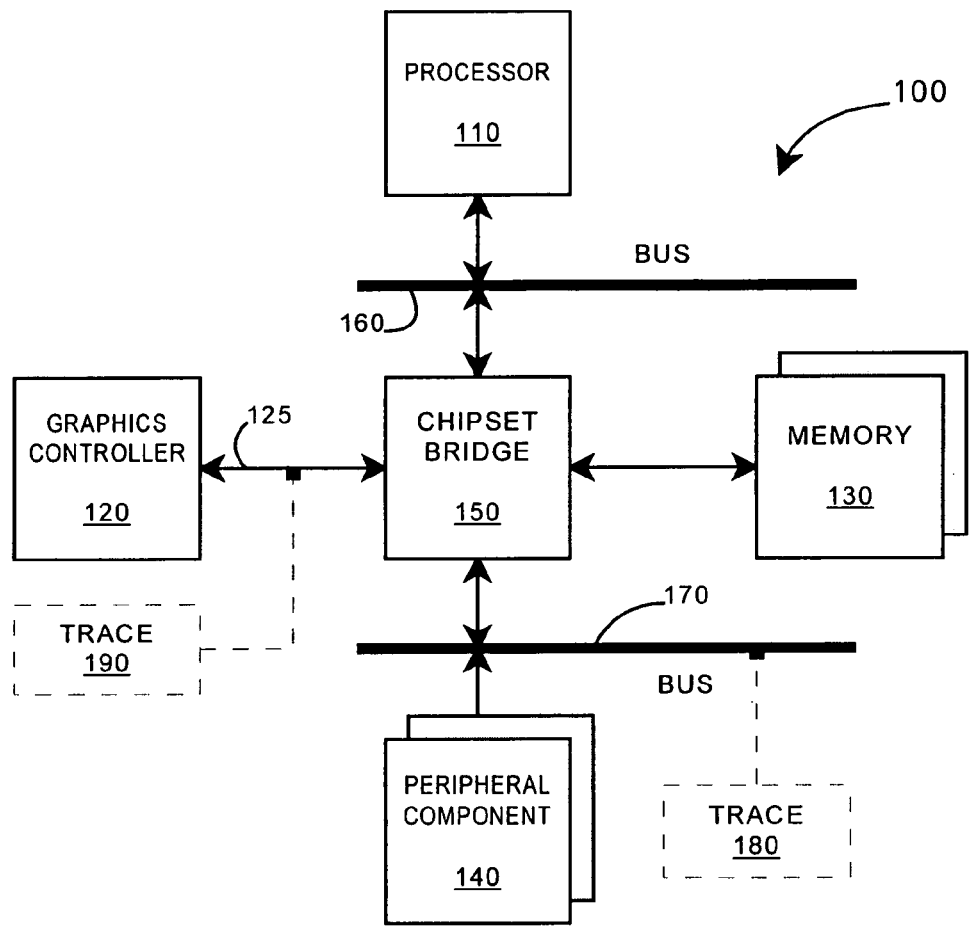
FIG. 1 is a block diagram of an exemplary computer system.
Figure 3:
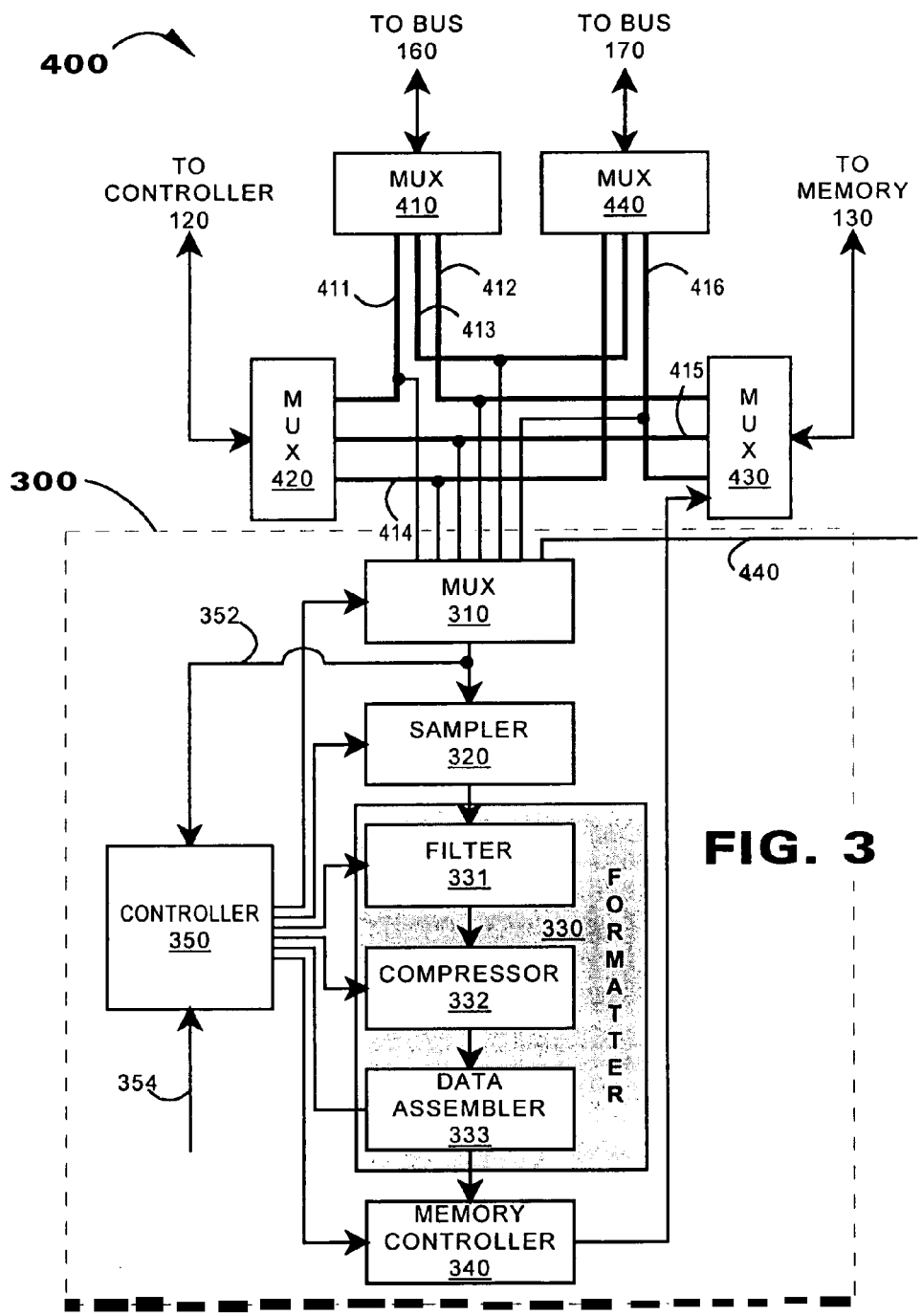
FIG. 3 is a block diagram of a bridge interface constructed in accordance with an embodiment of the present invention.

FIG. 3 illustrates a trace analyzer 300 constructed in accordance with the present the invention. The trace analyzer 300 is provided within an integrated circuit such as a bridge interface. As illustrated, the trace analyzer 300 is provided in conjunction with circuitry 400 that constitutes a conventional bridge interface 150 (FIG. 1). A typical bridge interface 400 includes a selection multiplexer provided for each data input to the bridge interface. Thus, a multiplexer 410 may be provided in communication with bus 160 (FIG. 1). A multiplexer 420 is provided in communication with the graphics controller 120 (FIG. 1). Multiplexer 430 may be provided in communication with memory 130 (FIG. 1). And multiplexer 440 may be provided in communication with bus 170 (FIG. 1). Each multiplexer 410, 420, 430, 440 includes a separate data path, one extending to each of the other multiplexers 410–440. Thus, data path 411 extends from multiplexer 410 to multiplexer 420. Data path 412 extends from multiplexer 410 to multiplexer 430. Data path 413 extends from multiplexer 410 to multiplexer 440. Data paths 414–416 interconnects the remaining multiplexers 420–440 to each other.

The multiplexers 410–440 operates under control of an interface controller (not shown). During operation, each multiplexer 410–440 establishes a "live" connection with just one other multiplexer 410–440 in the bridge interface 400. For example, multiplexer 410 may receive data from bus 160 and output the data to multiplexer 420. Because multiplexer 420 receives data from multiplexer 410, it may not receive data from the graphics controller 120 (FIG. 1) and may not receive data from any of the other multiplexers 430–440. However, multiplexer 430 may receive data from the memory 130 (FIG. 1) and output it to multiplexer 440 at the same time that multiplexer 410 outputs data to multiplexer 420. Also, data paths 411–416 may include data conversion circuits (not shown) that reformat data from one format to another. For example, buses 160 and 170 each may operate according to their own different bus protocols, each having their own different signaling format. A data conversion circuit may permit data from bus 160 to be recharaterized as appropriate for bus 170. The data paths also may include buffering elements (not shown). In this regard, the operation of bridge interface circuits 400 is well-known.

An embodiment of the trace analyzer 300 includes a multiplexer 310, a sampler 320, a formatter 330 and a memory controller 340. The trace analyzer 300 operates under control of a controller 350. Controller 350 may or may not be integrated into the interface controller (not shown) that controls multiplexers 410–440. Multiplexer 310 includes a plurality of input parts one connected to each of the data paths 411–416. Multiplexer 300 also may include other input ports 417–419 from other hardware elements (not shown). An output signal from the memory controller 340 is input to multiplexer 430, the one coupled to memory 130 (FIG. 1).

During operation, the multiplexer 310 receives data from a selected one of the data paths 411–416. Selection of a data path may be determined by controller 350. For example, multiplexer 310 may receive data from data path 414. Multiplexer 310 outputs data received at its input port to the sampler 320. The sampler 320 samples data at times that may be determined by controller 350. The formatter 330 formats data received from the sampler 320 into a format appropriate for storage in memory 130 (FIG. 1). It outputs the formatted data to the memory controller 340. Memory controller 340 outputs data to multiplexer 430. Under control of controller 350, the memory controller 340 outputs data to the multiplexer 430 and may cause it to write the data to memory 130.

The controller 350 may determine when the trace analyzer 300 samples data. In a first embodiment, the controller 350 may cause the sampler 320 to sample data at a predetermined periodic rate. In alternative embodiments, controller 350 may be coupled to an input port 352 from an output port of the multiplexer 310. The controller 350 may cause the sampler 320 to sample data in response to the data input to it over input port 352. For example, the controller 350 may cause the sampler 320 to sample data in the presence of active data on input 352, when data signals of a predetermined type is present at input port 352 or when control signals 440 from another data source (not shown) are at some predetermined state.

According to an embodiment of the present invention, the formatter 330 may perform several formatting functions, depending upon the type of trace analysis performed. The formatter 330 may include one or more of a filter 331, a compressor 332 and a data assembler 333. The filter 331, when used, may select predetermined portions of sampled data. For example, if sampling occurs in response to a particular data signal present in a portion of the sampled data, the filter 331 may selectively eliminate that portion of the sampled data. Other uses of filtering are possible.

A compressor 332 may perform data compression upon sampled data. The sampled data is amenable for use with several well-known digital data compression processes such as run length encoding. Compression may be engaged by the controller 350 in response to an external control signal applied at input port 354.

A data assembler 333 organizes sampled data (whether compressed or not) into data units appropriate for storage in memory 130. As is known, memories are indexed by memory addresses. Each address refers to a unit of data, called a "memory line," having a predetermined size. The data assembler 333 may organize sampled data into memory line-sized units.

In an embodiment of the present invention, the trace analyzer 300 need not cause sampled data to be stored. For example, it is sometimes useful in trace analysis simply to count the number of times a particular event occurs during operation of a system. In this embodiment, the sampler 320 and formatter 330 may be omitted. The controller 350 may monitor data at input port 352 and may maintain a running count of occurrences of the event during a test interval. At the end of a test, it outputs a count value to the memory controller 340 and causes it to store the count value in memory 130 (FIG. 1).

According to the embodiment of the invention, the memory controller 340 outputs data to the multiplexer 430 that is coupled to memory 130. The memory controller 340 may also include addressing information to store captured data in a preselected area of memory. Returning to FIG. 1, according to an embodiment of the present invention, memory 130 may include a dedicated memory portion (not shown) to be used for storing data obtained from trace analysis. The memory controller 340 (FIG. 3) controls multiplexer 430 to output captured data in the dedicated memory portion.

According to a further embodiment of the present invention, operation of controller 350 may be configured signals received via an external input port 354. Input port 354 receives signals external to the integrated circuit and provides an operator access to controller 350 to configure its operation. Through input port 354, an operator may specify, for example, a data path 411–416 on which trace analysis is to be performed, a sampling rate for trace analysis, any event that should cause trace analysis to be performed, types of data to be sampled, subsets of data to be selected for sampling, compression processes to be applied to sample data, and areas of memory 130 in which captured data should be stored, for example.

Alternatively, configuration of the trace analyzer 300 could occur through one of the interface multiplexers (say, multiplexer 410). As noted, bus 160 typically is associated with its own predetermined bus protocol. In an embodiment, the controller 350 monitors data from bus 160 via a data path 411, 412 or 413 and input 352. Commands to the controller 350 may be entered through this path by using a predetermined bus command that is invalid for normal operation of the bus 160.

Figure 2:
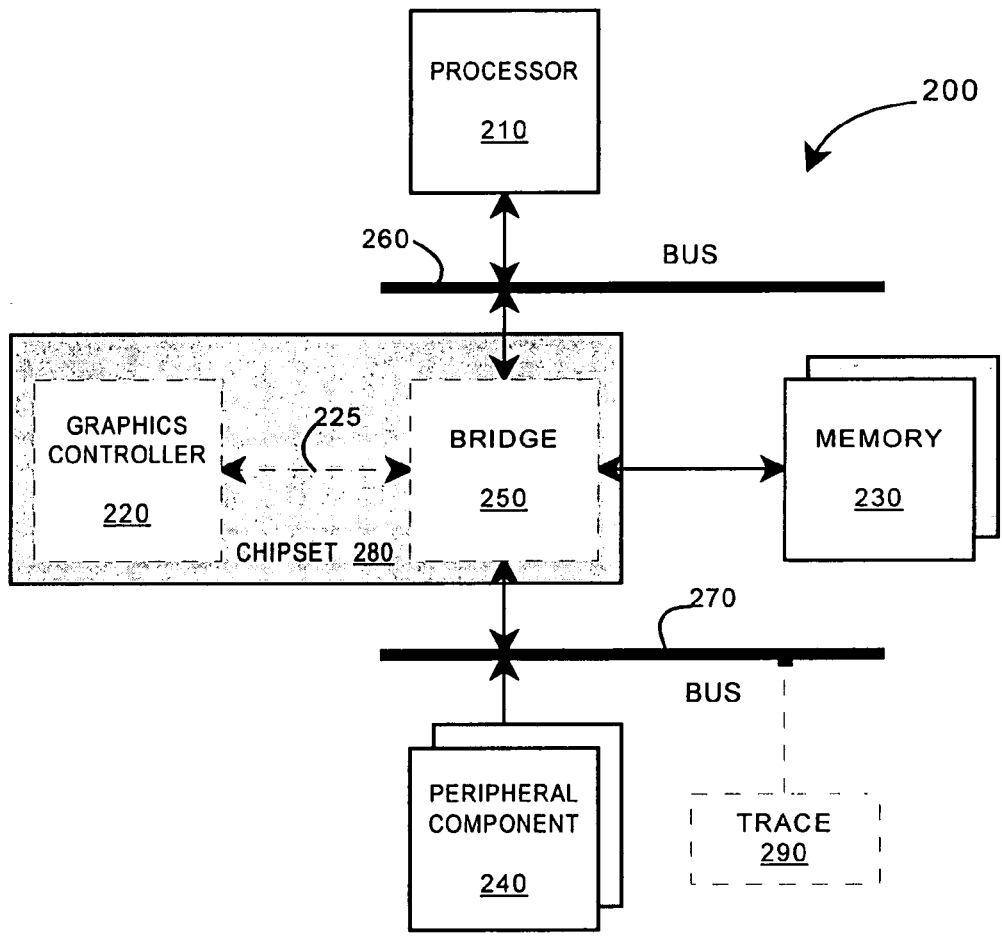
FIG. 2 is a block diagram of a computer system constructed in accordance with an embodiment of the present invention.

The trace analyzer 300 provides a flexible trace analyzer integrated into a traditional bridge interface 150 (FIG. 1). By controlling multiplexer 310, the trace analyzer may sample data from any of the data paths 411–416 provided in the bridge interface 400. The trace analyzer 300 may be used in the systems of FIG. 1 and FIG. 2. In the system of FIG. 1, where components 110–140 are provided in separated integrated circuits, the trace analyzer 300 may be provided in bridge interface 150 and obviate the need for an external trace analyzer 180 or 190 (even through trace analyzers 180–190 otherwise could be used for such a system). Further, the trace analyzer 300 may be provided in the bridge interface 250 of FIG. 2. Again, the trace analyzer 300 (FIG. 3) may be controlled to capture data extending between the bridge interface 250 and the graphics controller 220 along data path 225. However, the trace analyzer 300 has broader applications and can sample data applied to the chip 280 from external processor 210, the memory 230 and/or the peripheral devices 240. Again, provision of a trace analyzer 300 (FIG. 3) in the bridge interface 250 in FIG. 2 obviates the need for trace analyzer 290 provided on bus 270 or for a trace analyzer provided on any other external data path extending from chip 280.

Figure 4:
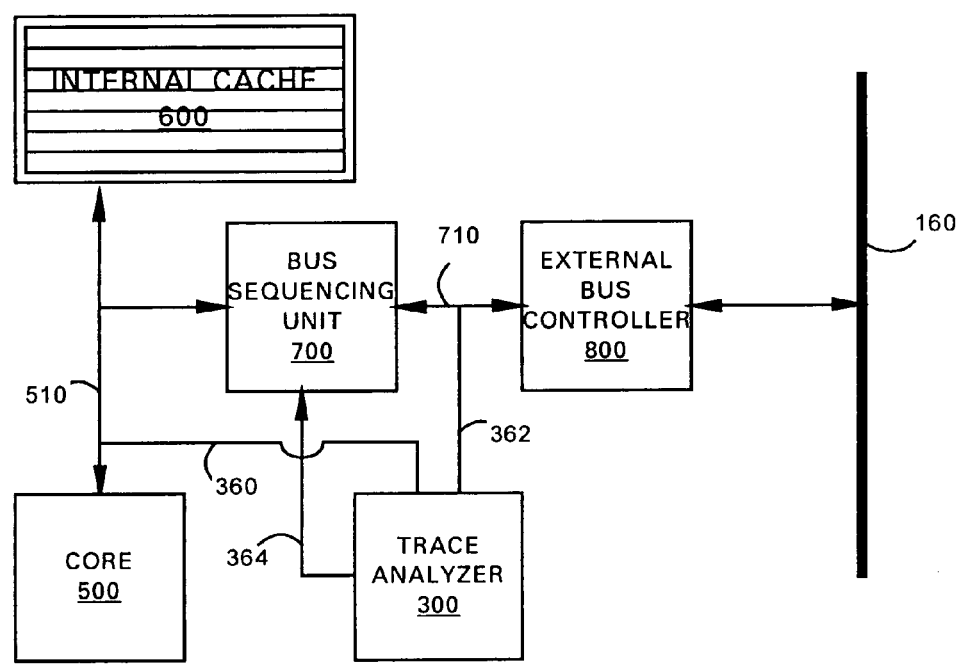
FIG. 4 is a block diagram of a processor constructed in accordance with an embodiment of the present invention.

FIG. 4 illustrates a processor constructed according to an embodiment of the present invention. The processor may include a processing core 500, an internal cache 600, a bus sequencing unit 700 and an external bus controller 800. As is known, the processing core 500 reads and executes program instructions and may modify data. The internal cache 600 may store data for immediate use by the processor core 500. The bus sequencing unit 700 may manage requests issued by the core 500 as they are posted and progress on the external bus 160. And the external bus controller 800 drives signals on the external bus 160 and reads signals driven on the external bus 160 by other processing agents (not shown).

In this embodiment, such a processor may include a trace analyzer 300 adapter to read and record data that is exchanged among the processor components 500–800. For example, as illustrated, the trace analyzer 300 includes inputs ports 360, 362 coupled respectively to data paths 510, 710 within the processor. The trace analyzer 300 also includes an output port 364 coupled to the bus sequencing unit 700. Alternatively, output port 364 could be coupled directly to the external bus controller 800.

The trace analyzer 300 may be adapted to record data as it progresses through the processor. Inputs ports 360 and 362 are coupled to the multiplexer 310 (FIG. 3). Output port 364 is coupled to the memory controller 340 (FIG. 3). According to this embodiment, the trace analyzer 300 samples and formats, as appropriate, data from a selected data path 510, 710. In this embodiment, however, because the processor is not provided in direct communication with a memory 130 (FIG. 1), the trace analyzer 300 causes the bus sequencing unit 700 to generate an external bus transaction to write the data to memory 130. Thus, in this embodiment, memory controller 340 (FIG. 3) generates a data request according to formats used by, for example, the core 500 to cause the processor to store data in a system memory.

Application of the trace analyzer 300 is not limited simply to bridge interface or processors. The trace analyzer 300 may be used in any integrated circuit that carries data for trace analysis and that may communicate with a memory. The trace analyzer 300 may be used in an integrated circuit that communicates directly with the memory (as bridge interface 150 does) or in an integrated circuit that communicates indirectly with the memory (as processor 110 does via bus 160 and bridge interface 150).

Several embodiments of the present invention are specifically illustrated and described herein. However, it will be appreciated that modifications and variations of the present invention are covered by the above teachings and within the purview of the appended claims without departing from the spirit and intended scope of the invention.

We claim:

1. A bridge interface, comprising:
a plurality of mutually interconnected multiplexers comprising at least three multiplexers,
a plurality of communication paths composed of interconnections between the plurality of mutually interconnected multiplexers, each multiplexer being separately interconnected with every other multiplexer of the plurality of mutually interconnected multiplexers, at least two of the communication paths being active simultaneously, and
a trace analyzer having input ports with connected to each of the plurality of communication paths, the analyzer to capture data from a selected one of the communication paths.

2. The bridge interface of claim 1, wherein the trace analyzer includes an output port in communication with one of the multiplexers.

3. The bridge interface of claim 1, wherein the trace analyzer comprises:
a multiplexer to receive the trace analyzer inputs,
a sampler in communication with the multiplexer, and
a memory controller in communication with the sampler.

4. The bridge interface of claim 3, wherein the memory controller includes an output in communication with one of the plurality of mutually interconnected multiplexers.

5. The bridge interface of claim 3, wherein the trace analyzer further comprises a controller provided in communication with the multiplexer of the trace analyzer.

6. The bridge interface of claim 1, wherein the plurality of interconnected multiplexers are fixedly interconnected by the plurality of communication paths, each of the input ports being fixedly connected to a respective one of the communications paths in between the plurality of mutually interconnected multiplexers.

7. A bridge interface, comprising:
a plurality of mutually interconnected multiplexers,
a plurality of communication paths formed by each multiplexer being separately interconnected with every other multiplexer of the plurality of mutually interconnected multiplexers, at least two of the communication paths being active simultaneously, and
a trace analyzer having input ports in communication with each of the plurality of communication paths, the analyzer to capture data from a selected one of the communication paths,
wherein the trace analyzer comprises:
a multiplexer to receive the trace analyzer inputs,
a sampler in communication with the multiplexer, and
a memory controller in communication with the sampler, and
wherein the trace analyzer further comprises a formatter provided in communication with the sampler and having a output port in communication with the memory controller.

8. A bridge interface, comprising:
a plurality of mutually interconnected multiplexers comprising at least three multiplexers, each multiplexer to selectively pass data from one of a plurality of discrete data paths connected to the respective multiplexer, each of the plurality of discrete data paths of a connected to the respective multiplexer connecting to another multiplexer among the plurality of multiplexers, the discrete data paths interconnecting each of the multiplexers with every other multiplexer of the plurality of multiplexers, and a trace analyzer having input ports connected to each of the discrete data paths interconnecting the plurality of mutually interconnected multiplexers, wherein the trace analyzer and the plurality of multiplexers are provided within an integrated circuit chip.

9. The bridge interface of claim 8, wherein the trace analyzer includes an output port in communication with one of the bridge interface multiplexers.

10. The bridge interface of claim 8, wherein the trace analyzer further comprises:

a trace analyzer multiplexer to receive trace analyzer inputs via the input ports, a sampler in communication with the trace analyzer multiplexer, and a memory controller in communication with the sampler.

11. The bridge interface of claim 10, wherein the trace analyzer further comprises a controller provided in communication with the multiplexer of the trace analyzer.

12. The bridge interface of claim 8, wherein each of the paths of the respective multiplexers fixedly extend to another multiplexer among the plurality of multiplexers, each of the input ports being fixedly connected to a respective one of the data paths in between the plurality of mutually interconnected multiplexers, the data paths fixedly interconnecting each of the multiplexers with every other multiplexer of the plurality of multiplexers.

13. A bridge interface, comprising:

a plurality of mutually interconnected multiplexers, each multiplexer having a plurality of discrete data paths, each data path extending to every other multiplexer among the plurality of multiplexers, and a trace analyzer having input ports in communication the data paths, wherein the trace analyzer and the plurality of multiplexers are provided within an integrated circuit chip, wherein the trace analyzer further comprises:

a trace analyzer multiplexer to receive trace analyzer inputs via the input ports, a sampler in communication with the trace analyzer multiplexer, and a memory controller in communication with the sampler, and wherein the memory controller includes an output in communication with one of the plurality of mutually interconnected bridge interface multiplexers.

14. A bridge interface, comprising:

a plurality of mutually interconnected multiplexers, each multiplexer having a plurality of discrete data paths, each data path extending to every other multiplexer among the plurality of multiplexers, and a trace analyzer having input ports in communication the data paths, wherein the trace analyzer and the plurality of multiplexers are provided within an integrated circuit chip, wherein the trace analyzer further comprises:

a trace analyzer multiplexer to receive trace analyzer inputs via the input ports, a sampler in communication with the trace analyzer multiplexer, and a memory controller in communication with the sampler, and wherein the trace analyzer further comprises a formatter provided in communication with the sampler and having an output port in communication with the memory controller.

15. A bridge interface, comprising:

a plurality of mutually interconnected multiplexers, each multiplexer having a separate bus extending to each of the other multiplexers, and a trace analyzer comprising:

input ports in communication with each of the buses, a trace analyzer multiplexer connected to the input ports, a sampler to receive an input from the trace analyzer multiplexer, and a memory controller in communication with the sampler, the trace analyzer and the plurality of multiplexers being provided within a single integrated circuit chip, wherein the memory controller comprises an output coupled to one of the plurality of mutually interconnected multiplexers.

16. The bridge interface of claim 15, wherein the trace analyzer further comprises a controller coupled to the multiplexer of the trace analyzer.

17. A bridge interface, comprising:

a plurality of mutually interconnected multiplexers, each multiplexer having a separate bus extending to each of the other multiplexers, and a trace analyzer comprising:

input ports in communication with each of the buses, a trace analyzer multiplexer connected to the input ports, a sampler to receive an input from the trace analyzer multiplexer, and a memory controller in communication with the sampler, the trace analyzer and the plurality of multiplexers being provided within a single integrated circuit chip, wherein the trace analyzer further comprises a formatter coupled to the sampler and an output coupled to the memory controller.

18. The bridge interface of claim 17, wherein the trace analyzer further comprises a controller coupled to the multiplexer of the trace analyzer.

19. A bridge interface, comprising:

a plurality of multiplexers comprising at least three multiplexers, a plurality of discrete communication paths, with a respective discrete communication path interconnecting each pair of multiplexers of the plurality of multiplexers, each multiplexer of the plurality of multiplexers being interconnected with every other multiplexer of the plurality of multiplexers, a trace analyzer comprising input ports coupled to each of the discrete communication paths between each pair of multiplexers, wherein the trace analyzer and the plurality of multiplexers are provided within a single integrated circuit chip.

20. The bridge interface of claim 19, wherein the discrete communication paths fixedly interconnect each pair of multiplexers of the plurality of multiplexers to each other.

21. A system, comprising:

a bridge interface chip coupled to a at least three external communication paths, the bridge interface chip comprising:

a plurality of multiplexers comprising at least three multiplexers, with a respective multiplexer associated with each of the external communication paths, each multiplexer coupled to each of the other multiplexers by a respective discrete internal communication path, the internal communications paths interconnecting each of the multiplexers with every other multiplexer of the plurality of multiplexers; and a trace analyzer to capture signals on the internal communication paths, the trace analyzer coupled to each of the internal communication paths between the plurality of multiplexers by an internal multiplexer, the trace analyzer having an output coupled to one of the plurality of multiplexers, and a system memory chip coupled to the bridge interface chip by one of the external communication paths, the external communication path coupled to one the plurality multiplexer that is also coupled to the output of the trace analyzer.

22. The system of claim 21, wherein the trace analyzer comprises:

the internal multiplexer to receive the trace analyzer inputs, a sampler in communication with the internal multiplexer, and a memory controller in communication with the sampler.

23. The system of claim 22, wherein the trace analyzer further comprises a controller provided in communication with the internal multiplexer of the trace analyzer.

24. The system of claim 21, wherein each multiplexer is fixedly coupled to each of the other multiplexers by the respective discrete internal communication path, the internal communications paths fixedly interconnecting each of the multiplexers with every other multiplexer of the plurality of multiplexers.

25. A system, comprising:

a bridge interface chip coupled to a plurality of external communication paths, the bridge interface chip comprising:

a plurality of multiplexers associated with each of the external communication paths, each multiplexer coupled to every other multiplexer by a discrete internal communication path; and a trace analyzer to capture signals on each discrete internal communication path coupling the plurality of multiplexers, the trace analyzer coupled to the internal communication paths by an internal multiplexer, the trace analyzer having an output coupled to one of the plurality of multiplexers, and a system memory chip coupled to the bridge interface chip by one of the external communication paths, the external communication path coupled to one the plurality multiplexer that is also coupled to the output of the trace analyzer, wherein the trace analyzer comprises:

the internal multiplexer to receive the signals on each of the discrete internal communication paths as inputs, a sampler in communication with the internal multiplexer, and a memory controller in communication with the sampler, and wherein the memory controller includes an output in communication with one of the plurality of multiplexers that is also coupled to the external communication path of the system memory chip.

* * * * *

UNITED STATES PATENT AND TRADEMARK OFFICE
CERTIFICATE OF CORRECTION

PATENT NO. : 7,079,490 B1  Page 1 of 1
APPLICATION NO. : 09/204257
DATED : July 18, 2006
INVENTOR(S) : Frank Hady et al.

It is certified that error appears in the above-identified patent and that said Letters Patent is hereby corrected as shown below:

| Column | Line | |
|---|---|---|
| 6 | 12 | After "input ports" delete "with". |
| 6 | 55 | Change "a output port" to --an output port--. |
| 6 | 62 | After "data paths" delete "of a". |
| 8 | 49 | After "multiplexers," insert --and--. |
| 8 | 59 | After "coupled to" delete "a". |
| 9 | 11 | After "coupled to one" insert --of--. |
| 9 | 12 | Change "rality multiplexer" to --rality of multiplexers--. |
| 10 | 13 | After "coupled to one" insert --of--. |
| 10 | 14 | Change "rality multiplexer" to --rality of multiplexers--. |

Signed and Sealed this

Fifth Day of December, 2006

JON W. DUDAS
*Director of the United States Patent and Trademark Office*